(12) United States Patent
Kakuda et al.

(10) Patent No.: US 10,020,791 B2
(45) Date of Patent: Jul. 10, 2018

(54) FERRITE COMPOSITION AND ELECTRONIC COMPONENT

(71) Applicant: TDK CORPORATION, Tokyo (JP)

(72) Inventors: Kouichi Kakuda, Tokyo (JP); Ryuichi Wada, Tokyo (JP); Yukari Akita, Tokyo (JP); Yukio Takahashi, Tokyo (JP); Takashi Suzuki, Tokyo (JP); Asuka Murai, Tokyo (JP); Hiroyuki Tanoue, Tokyo (JP)

(73) Assignee: TDK CORPORATION, Tokyo (JP)

( * ) Notice: Subject to any disclaimer, the term of this patent is extended or adjusted under 35 U.S.C. 154(b) by 270 days.

(21) Appl. No.: 15/090,129

(22) Filed: Apr. 4, 2016

(65) Prior Publication Data
US 2016/0293302 A1  Oct. 6, 2016

(30) Foreign Application Priority Data

Apr. 2, 2015  (JP) .................... 2015-076159
Mar. 15, 2016  (JP) .................... 2016-051088

(51) Int. Cl.
| | | |
|---|---|---|
| C04B 35/30 | (2006.01) | |
| H03H 7/01 | (2006.01) | |
| C04B 35/26 | (2006.01) | |
| H01F 1/34 | (2006.01) | |
| H01F 17/00 | (2006.01) | |
| H01F 17/04 | (2006.01) | |

(52) U.S. Cl.
CPC ......... *H03H 7/0115* (2013.01); *C04B 35/265* (2013.01); *H01F 1/344* (2013.01); *H01F 17/0013* (2013.01); *H01F 17/04* (2013.01); *H01F 2017/0026* (2013.01); *H01F 2017/048* (2013.01)

(58) Field of Classification Search
CPC ..... C04B 35/265; H03H 7/0115; H01F 1/344; H01F 17/0013; H01F 17/04; H01F 2017/0026; H01F 2017/048
See application file for complete search history.

(56) References Cited

U.S. PATENT DOCUMENTS

| | | |
|---|---|---|
| 6,287,479 B1 | 9/2001 | Tanaka |
| 2002/0158737 A1 | 10/2002 | Yokoyama |
| 2010/0163779 A1* | 7/2010 | Okano ................ B32B 18/00 |
| | | 252/62.56 |
| 2014/0333405 A1 | 11/2014 | Choto et al. |
| 2015/0097137 A1 | 4/2015 | Wada et al. |

FOREIGN PATENT DOCUMENTS

| | | |
|---|---|---|
| CN | 101691297 A | 4/2010 |
| CN | 104513058 A | 4/2015 |
| JP | H01-101609 A | 4/1989 |
| JP | H02-137301 A | 5/1990 |
| JP | H03-93667 A | 4/1991 |
| JP | H03-218962 A | 9/1991 |
| JP | H08-231268 A | 9/1996 |
| JP | H09-295862 A | 11/1997 |
| JP | 2002-075722 A | 3/2002 |
| JP | 2002-134312 A | 5/2002 |
| JP | 2002-145657 A | 5/2002 |
| JP | 2002255637 A | 9/2002 |
| JP | 2004-296865 A | 10/2004 |
| JP | 2005-145781 A | 6/2005 |
| JP | 2006-151702 A | 6/2006 |
| JP | 2006-206347 A | 8/2006 |
| JP | 2007-103869 A | 4/2007 |
| JP | 2007-145703 A | 6/2007 |
| JP | 2008-016619 A | 1/2008 |
| JP | 2010-103266 * | 5/2010 |
| JP | 2010-103266 A | 5/2010 |
| JP | 2013060322 A | 4/2013 |
| JP | 2013-147395 A | 8/2013 |

OTHER PUBLICATIONS

Mar. 13, 2018 Office Action issued in Chinese Application No. 201610196272.2.

\* cited by examiner

*Primary Examiner* — C Melissa Koslow
(74) *Attorney, Agent, or Firm* — Oliff PLC

(57) ABSTRACT

Provided is a ferrite composition composed of: a main component including 23.0 to 47.0 mole % of Fe compound in terms of $Fe_2O_3$, 3.0 to 16.0 mole % of Cu compound in terms of CuO, 4.0 to 39.0 mole % of Zn compound in terms of ZnO, 1.5 to 13.0 mole % of Si compound in terms of $SiO_2$, and a residue of Ni compound; and a subcomponent including, with respect to 100 parts by weight of the main component, 0.1 to 8.0 parts by weight of Co compound in terms of $Co_3O_4$ and 0.25 to 5.00 parts by weight of Bi compound in terms of $Bi_2O_3$.

4 Claims, 2 Drawing Sheets

FERRITE COMPOSITION AND ELECTRONIC COMPONENT

BACKGROUND OF THE INVENTION

1. Field of the Invention

The present invention relates to ferrite compositions preferable for manufacturing such as a multilayer inductor, and to electronic components having said compositions.

2. Description of the Related Art

Progress in enhancement of portable equipments such as smartphones is remarkable. In recent years, employment of NFC (near field communication), non-contact power supply, and so on is facilitating; and the circuits in which higher AC current flows relative to a conventional are increasing.

Further, corresponding to the densification of the electronic components, demands for the size-reduction of the devices are still great. Q-value of an inductance element generally decreases as AC current increases or the size reduces. Under such circumstances, there is a demand for a core material, providing a high Q-value even AC current increases or the size reduces, and for the inductance element thereof.

In particular, it is required to integrally fire a coil conductor and a ferrite layer in a multilayer inductor. Thus, the sintering temperature of the ferrite composition for the multilayer inductor is required to be below the melting point of the coil conductor.

Patent Article 1 discloses a magnetic material having anti-stress characteristic by an addition of $SiO_2$ and CoO to the NiCuZn based ferrite. The magnetic material of the Patent Article 1, however, is a material sintered at 1,050° C. or more. In addition, Q value at high current amplitude is not shown.

Patent Article 2 discloses a ferrite material having a superior DC-current superimposition characteristic by using NiCuZn based ferrite composed of spinel ferrite and zinc silicate. The ferrite material disclosed in the Patent Article 2, however, does not show Q value at high current amplitude.

Patent Article 3 discloses a ferrite material with a small magnetic loss even at high current amplitude by the addition of cobalt oxide to NiCuZn based ferrite. The ferrite material disclosed in the Patent Article 3, however, often is not possible to satisfy the requirement of the recent temperature characteristics due to a large temperature change rate of the inductance.

By the techniques of the above Patent Articles 1 to 3, although certain effects can be obtained for the characteristics each technique is aiming for, the other characteristics are often sacrificed. Further, the use will be limited when it excels in only one characteristic. Therefore, more enhanced ferrite compositions are demanded.

[Patent Article 1] Japanese Unexamined Patent Publication No. H02-137301

[Patent Article 2] Japanese Patent No. 5582279

[Patent Article 3] Japanese Unexamined Patent Publication No. 2013-060332

SUMMARY OF THE INVENTION

The present invention has been made by considering the above circumstances, and an object of the invention is to provide the ferrite composition, which may be sintered at a low temperature, has small Q value change with respect to an external magnetic field change under high external magnetic fields (several tenth to several hundreds A/m), has less deterioration of Q value at high current amplitude, has good DC-current superimposition characteristic, and has superior temperature characteristic; and electronic components capable of size-reduction.

In order to achieve such object, ferrite composition according to the invention has a main component including 23.0 to 47.0 mole % of Fe compound in terms of $Fe_2O_3$, 3.0 to 16.0 mole % of Cu compound in terms of CuO, 4.0 to 39.0 mole % of Zn compound in terms of ZnO, 1.5 to 13.0 mole % of Si compound in terms of $SiO_2$, and the residue of Ni compound. And with respect to 100 parts by weight of the main component, 0.1 to 8.0 parts by weight of Co compound in terms of $Co_3O_4$ and 0.25 to 5.00 parts by weight of Bi compound in terms of $Bi_2O_3$ are included for the subcomponent.

The ferrite composition of the invention is possible to sinter at a low temperature by determining the content amount of the oxides composing the main component within the above range, and further including bismuth oxide and cobalt oxide within the above range as subcomponent. For instance, it can be sintered at around 900° C. (950° C. or less), which is the same or less with the melting point of Ag, possible to be used as an internal electrode. In addition, the ferrite composition according to the invention, after the sintering, even when the external magnetic field is increased under high external magnetic fields (several tenth to several hundreds A/m) relative to the conventional external magnetic field (1 to 2 A/m), decrease rate of Q value is small and the deterioration of the Q value with respect to the high current amplitude is less. In addition, temperature characteristics and DC-current super imposition characteristic of the ferrite composition according to the invention are superior, and specific resistance thereof is also great.

Characteristics of the ferrite sintered body composed of the ferrite composition according to the invention are not deteriorated under signals of wide amplitude, as mentioned above. Thus, the electronic components thereof can be size-reduced.

The ferrite sintered body composed of the ferrite composition according to the invention is superior in DC-current superimposition characteristic as mentioned above, permeability change with respect to impressed magnetic field is less, and a stable inductance can be obtained. Therefore, even when the electronic components are size-reduced, said devices and large electronic components using the conventional ferrite have no difference in characteristics.

Temperature characteristics of the ferrite composition according to the invention are superior, as mentioned above. Thus, electronic components such as magnetic core or multilayer inductor using the ferrite composition according to the invention can be suitably used in wide ranging temperature environments.

In addition, Ag can be used as the internal electrode of the electronic components using the ferrite composition of the present invention. Ag is inexpensive and DC resistance is small compared to the other metals.

The ferrite composition according to the invention preferably has $Zn_2SiO_4$ phase.

The electronic component according to the invention is an electronic component including the ferrite sintered body composed of the abovementioned ferrite composition.

For instance, said electronic component is composed by laminating the coil conductor and the ceramic layer; and said coil conductor includes Ag and said ceramic layer is composed of the abovementioned ferrite composition.

Characteristics of the electronic component of the invention, relative to the same of the electronic component including the ferrite sintered body composed of the conventional ferrite composition, will not be deteriorated under signals of wide amplitude; and thus, the electronic component can be size-reduced.

An indication of obtaining such effects conceived to be compounded effects obtainable by setting the content amounts of the main component within a predetermined range and of each component within a particular range.

Note the ferrite sintered body composed of the ferrite composition according to the invention is preferable for the multilayer inductor, the multilayer L-C filter, the multilayer common mode filter, and composite electronic components by the other laminating method, and so on. For instance, it is also suitably used for the LC composite electronic component, the NFC coil, the multilayer impedance element and the multilayer transformer.

DESCRIPTION OF THE PREFERRED EMBODIMENTS

Hereinafter, the present invention will be described based on the embodiments shown by the figures.

Figure 1:
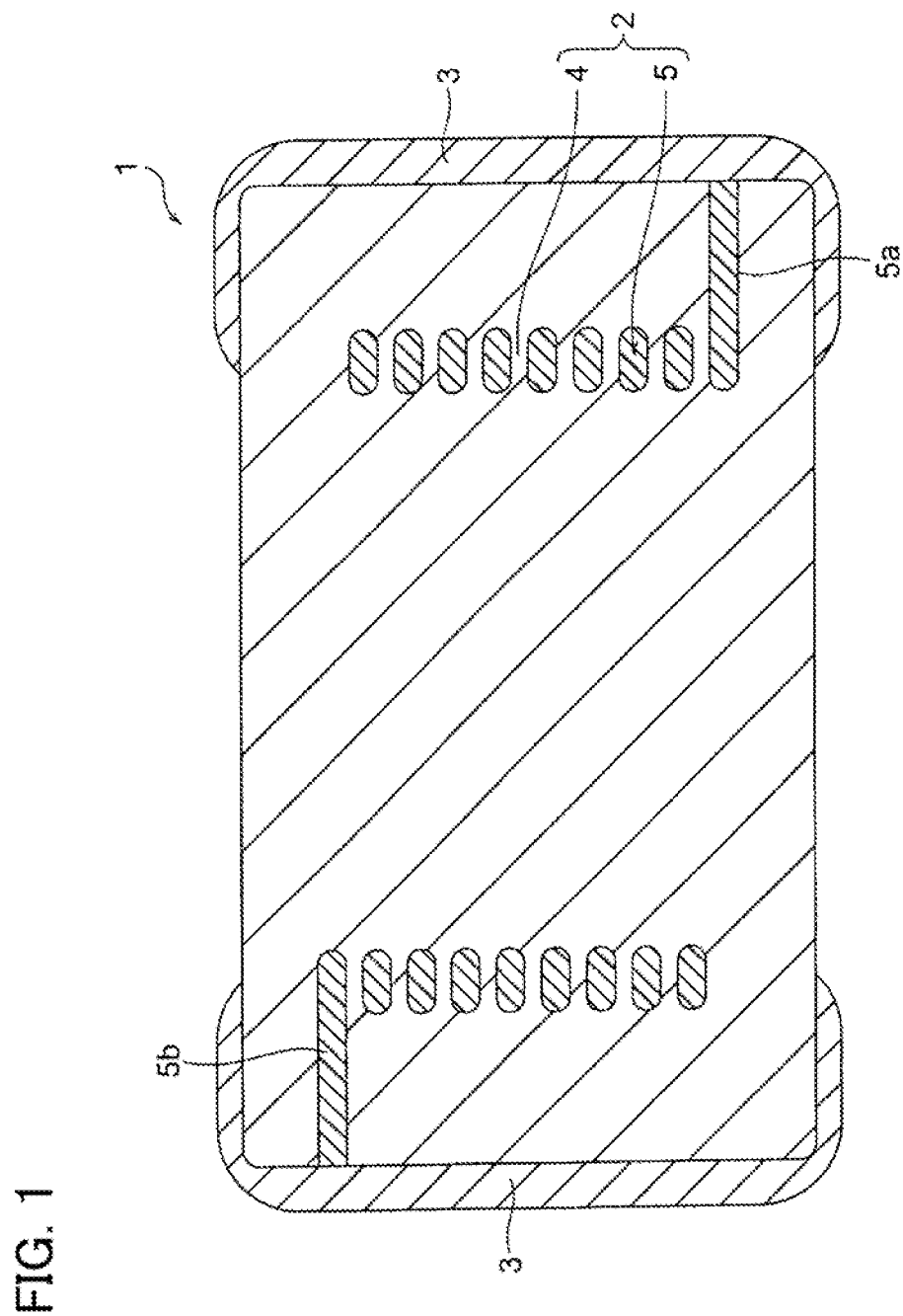
FIG. 1 is a cross-sectional view of the multilayer inductor according to an embodiment of the present invention.

As is shown in FIG. 1, the multilayer inductor 1 according to an embodiment of the invention has the element 2 and the terminal electrode 3. The element 2 is obtainable by firing a green multilayered body in which the coil conductor 5 is formed three-dimensionally in a spiral shape via ferrite layer 4. The ferrite layer 4 is composed by the ferrite composition according to an embodiment of the invention. The multilayer inductor 1 is obtainable by forming terminal electrodes 3 on both ends of the element 2 and connecting the terminal electrodes 3 via extraction electrodes 5a, 5b. Formation of the element 2 is not particularly limited; and it is generally a rectangular parallelepiped shape. Further, the size is not particularly limited, and can be suitably determined according to the usage.

Materials of the coil conductor 5 and the extraction electrodes 5a, 5b are not particularly limited, and Ag, Cu, Au, Al, Pd, Pd/Ag alloys, and so on can be used. Note Ti compound, Zr compound, Si compound, and so on may be added.

The ferrite composition according to the present embodiment includes iron oxide, copper oxide, zinc oxide, nickel oxide, and silicon oxide as main components.

Content amount of iron oxide is, in terms of $Fe_2O_3$, 23.0 to 47.0 mole %, preferably 28.0 to 44.0 mole %, and more preferably 33.0 to 37.0 mole %, among 100 mole % of the main component. Sintering property is deteriorated when content amount of the iron oxide is excessively large or excessively small. In particular, sintering density during sintering at low temperature tends to decrease. Further, specific resistance is remarkably lowered by deterioration of the sintering property.

Content amount of the copper oxide is, in terms of CuO, 3.0 to 16.0 mole %, preferably 5.0 to 14.0 mole %, more preferably 5.5 to 14.0 mole %, and the most preferably 7.0 to 8.0 mole %, among 100 mole % of the main component. In case when content amount of the copper oxide is excessively small, the sintering property is deteriorated, and in particular, sintering density during sintering at a low temperature tends to decrease. Further, specific resistance is remarkably lowered by deterioration of the sintering property. In case content amount of copper oxide is excessively large, the lowering rate of the Q value, with respect to the increase of DC-current superimposition characteristic and of the external magnetic field, tends to deteriorate.

Content amount of zinc oxide is, in terms of ZnO, 4.0 to 39.0 mole %, preferably 5.0 to 39.0 mole %, and more preferably 21.0 to 32.0 mole %, among 100 mole % of the main component. Initial permeability μi tends to be excessively low when content amount of the zinc oxide is excessively small. In case content amount of zinc oxide is excessively large, the lowering rate of the Q value, with respect to the increase of DC-current superimposition characteristic and an increase of the external magnetic field, tends to deteriorate, and Curie temperature also tends to decrease.

Content amount of silicon oxide is, in terms of $SiO_2$, 1.5 to 13.0 mole %, preferably 3.0 to 11.0 mole %, and more preferably 7.0 to 9.5 mole %, among 100 mole % of the main component. In case content amount of silicon oxide is excessively small, the lowering rate of the Q value, with respect to the increase of DC-current superimposition characteristic and an increase of the external magnetic field, tends to deteriorate; while when excessively large, the lowering rate of the Q value, with respect to the increase of DC-current superimposition characteristic and of the external magnetic field, also tends to deteriorate.

The residue of the main component is composed of a nickel oxide.

The ferrite composition according to the embodiment of the invention includes bismuth oxide and cobalt oxide as subcomponents in addition to the above main components.

Content amount of bismuth oxide is, in terms of $Bi_2O_3$, 0.25 to 5.00 parts by weight, preferably 0.50 to 3.00 parts by weight, and more preferably 0.50 to 1.00 parts by weight, with respect to 100 parts by weight of the main component. In case when content amount of bismuth oxide is excessively small, sintering property tends to deteriorate, and sintering density tends to lower specially at a low temperature sintering. Further, specific resistance remarkably decreases as the sintering property deteriorates. In case when content amount of bismuth oxide is excessively large, specific resistance tends to decrease, and in addition, the lowering rate of the Q value, with respect to the increase of DC-current superimposition characteristic and of the external magnetic field, also tends to deteriorate.

Content amount of cobalt oxide is, in terms of $Co_3O_4$, 0.1 to 8.0 parts by weight, preferably 0.1 to 3.0 parts by weight, and more preferably 0.4 to 0.8 parts by weight, with respect to 100 parts by weight of the main component. In case when content amount of cobalt oxide is excessively small, specific resistance tends to lower. While in case when content amount of cobalt oxide is excessively large, specific resistance also tends to lower. Further, temperature characteristic of initial permeability tends to deteriorate.

Note content amount of each main component and each subcomponent hardly vary in each step from material powders to after firing during manufacturing of the dielectric ceramic composition.

The ferrite composition of the invention includes bismuth oxide and cobalt oxide as subcomponents within the above range, in addition to controlling the composition range of the main component to be within the above range. As a result, both high performance and low temperature sintering are realized. In concrete, ferrite composition according to the invention shows low decrease rate of Q value with respect to increase of the external magnetic field; and thus, decrease of Q value with respect to rise of the current amplitude is small. Further, the ferrite composition according to the invention shows superior DC-current superimposition characteristic and temperature characteristics of initial permeability. In addition, the ferrite composition according to the invention can be sintered at around 900° C., which is the melting point or less of Ag used as the internal electrode. Therefore, said ferrite composition can be suitably used in various ways. In addition, characteristic of the ferrite composition according to the invention do not deteriorate under the signals of wide amplitude; and thus, the electronic components thereof can be size-reduced.

Further, the ferrite composition according to the present embodiment, other than the above subcomponents, additional components such as manganese oxide such as $Mn_3O_4$, zirconium oxide, tin oxide, magnesium oxide, glass compound can be further included in such amounts as not to inhibit the effects of the invention. Although the content amounts of said additional components are not particularly limited, for instance, it is around 0.05 to 1.0 parts by weight.

In particular, content amount of magnesium oxide is preferably 0.5 pats by weight or less. By setting content amount of the magnesium oxide to 0.5 parts by weight or less, the reaction between MgO and $SiO_2$ is prevented, and the below mentioned $Zn_2SiO_4$ phase becomes easy to generate.

Further, the ferrite composition according to the present embodiment may include oxides of inevitable impurity element.

Concrete examples of the inevitable impurity element are C, S, Cl, As, Se, Br, Te, I, typical metal elements such as Li, Na, Mg, Al, Ca, Ga, Ge, Sr, Cd, In, Sb, Ba, Pb, transition metal elements such as Sc, Ti, V, Cr, Y, Nb, Mo, Pd, Ag, Hf, Ta. In addition, oxides of the inevitable impurity elements may be included in the ferrite composition if it is around 0.05 parts by weight or less.

In particular, sintering property and specific resistance are easy to improve by setting Al content amount to 0.05 parts by weight or less, in terms of $Al_2O_3$.

The average crystal grain size of crystal grains in the ferrite composition according to the present embodiment is preferably 0.2 to 1.5 µm.

Next, an example of a method of manufacturing the ferrite composition according to the present embodiment will be explained. First, starting materials (materials of the main component and of the subcomponent) are weighed to be a prescribed compositional ratio and then mixed to obtain the material mixture. Wet mixing using a ball mill, dry mixing using a dry mixer, and so on can be mentioned as said mixing method. Note starting materials having the average particle size of 0.05 to 1.0 µm is preferably used.

Iron oxide ($\alpha$-$Fe_2O_3$), copper oxide (CuO), nickel oxide (NiO), zinc oxide (ZnO), silicon oxide ($SiO_2$) or composite oxides can be used as the materials of the main component. Zinc silicate ($Zn_2SiO_4$) and the like may be mentioned as the abovementioned composite oxides. Further, various compounds, becoming the abovementioned oxides, composite oxides after firing, or the like, can be used. For instance, metal simple substance, carbonate, oxalate, nitrate, hydroxide, halide, organic metal compound, and so on can be mentioned as compounds which become the abovementioned oxides after firing.

Bismuth oxide and cobalt oxide can be used as the subcomponent material. Oxides which become the subcomponent material are not particularly limited and such as composite oxides may be used. Further, the other various compounds which become the abovementioned oxides or composite oxides after firing can be used. For instance, metal simple substance, carbonate, oxalate, nitrate, hydroxide, halide, organic metal compound, and so on can be mentioned as compounds which become the abovementioned oxides after firing.

Note $Co_3O_4$, an embodiment of cobalt oxide, is easy for storage and for handling; and the valency number thereof is stable in air. Therefore, it is preferable for materials of cobalt oxide.

Next, material mixtures are calcined, and calcined materials are obtained. The calcine is performed to convert the material mixture into a form suitable for the subsequent step, by thermal decomposition of the material, homogenization of the component, generation of the ferrite, and decomposition of ultrafine powder and grain growth to a suitable grain size due to sintering. Calcined time and calcined temperature are not particularly limited. Although calcine is generally carried out in atmosphere (air), calcine may be carried out in an atmosphere where oxygen partial pressure is lower than the atmosphere (air).

Next, pulverizing of the calcined material is carried out, and pulverized material is obtained. Said pulverization is carried out in order to obtain powders which have suitable sintering property by breaking coagulation of the calcined material. In case the calcined material forms large bulks, wet pulverizing using ball mill, attritor, and so on is carried out after the coarse pulverization. The wet pulverizing is carried out when the average grain size of the pulverized material becomes preferably 0.1 to 1.0 µm or so.

Note according to the method for manufacturing abovementioned pulverizing material, calcination is carried out after mixing the powders of the main component and powders of the subcomponent. The method for manufacturing the pulverized material, however, is not limited to the abovementioned method.

A part of the material powder among the material powders mixed before the calcination may be mixed during the pulverization of the calcined material after the calcination, instead of mixing with the other material powders before the calcination.

Silicon oxide, bismuth oxide and cobalt oxide are preferably mixed during the pulverization. In case when silicon oxide is mixed during pulverization of the calcined material, said silicon oxide is preferably mixed with a part of or entire zinc oxide; it becomes easy to form the below-mentioned $Zn_2SiO_4$ phase during the sintering step.

Further, in case mixing silicon oxide and zinc oxide during pulverization of the calcined material, the amount of the zinc oxide mixed during pulverization of the calcined material is preferably 1.0 to 3.0 times the amount of silicon oxide mixed during pulverization of the calcined material on the basis of substance quantity. With this amount, the latter mentioned $Zn_2SiO_4$ phase is easily formed during sintering process.

With the use of the obtained pulverized material, the multilayer inductor according to the embodiment is manufactured. Although the method of manufacturing the multilayer inductor is not limited, a sheet method is used hereinafter.

First, the obtained pulverized material is slurried with additives, such as solvent or binder, and manufactured a paste. Green sheet is formed using this paste. Next, the multilayer inductor according to the present embodiment is obtained by processing the formed green sheet to a predetermined formation, and then going through binder removal process and firing process. The firing is performed at a temperature of the melting point or less of the coil inductor 5 and the extraction electrodes 5a, 5b. For instance, in case when the coil inductor 5 and the extraction electrodes 5a, 5b are Ag (the melting point is 962° C.), it is preferably performed at 850 to 920° C. Firing time is generally 1 to 5 hours. The firing may be carried out in an atmosphere (air) or in an atmosphere where the oxygen partial pressure is lower than the atmosphere (air). Thus obtained multilayer inductor is composed of the ferrite composition according to the present embodiment.

Figure 2:
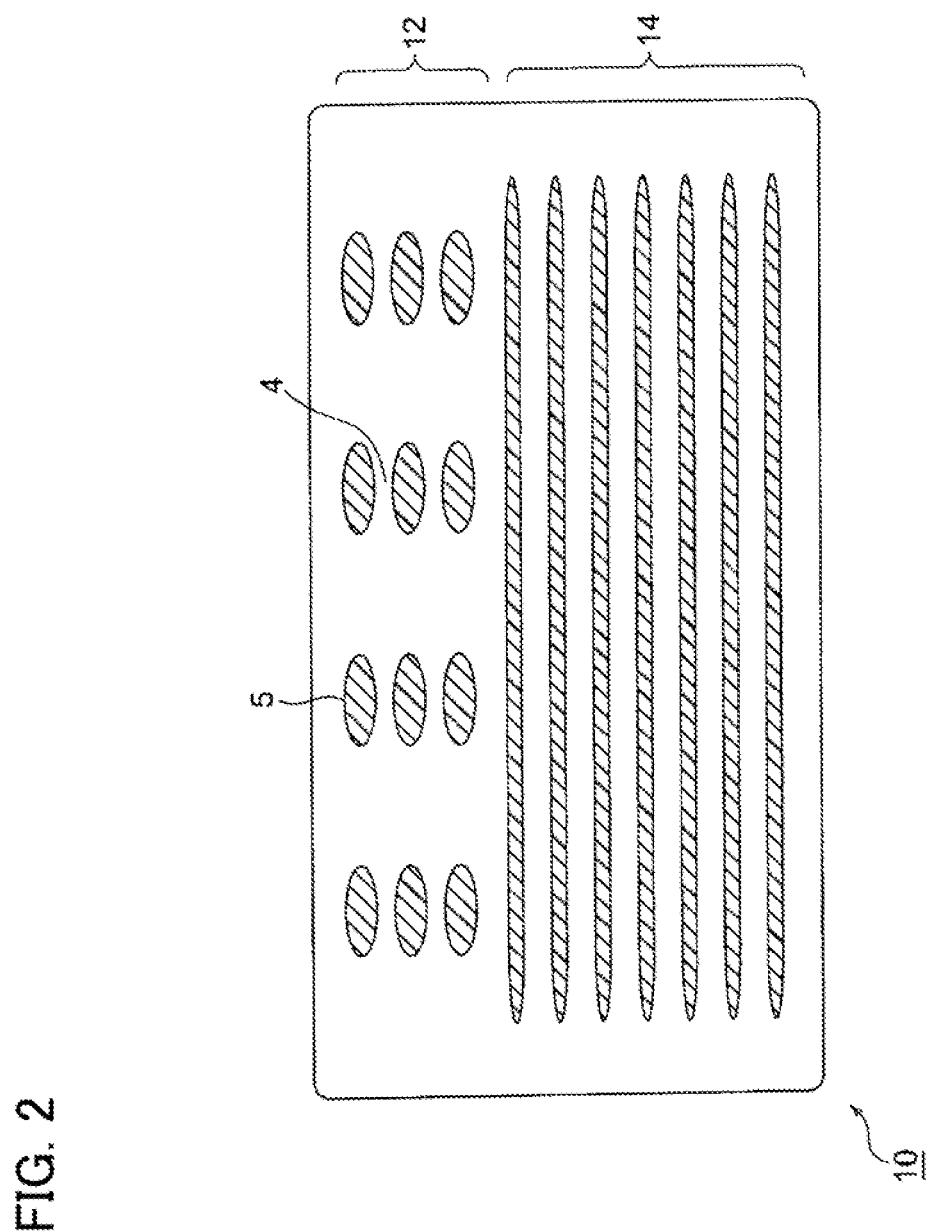
FIG. 2 is a cross-sectional view of LC composite electronic component according to an embodiment of the present invention.

Embodiments of the present invention are described hereinbefore, the invention is not limited to such embodiments, and can be carried out in various embodiments within a range not deviated from the outline of the invention. For instance, the ferrite composition of the invention can be used as the ferrite layer 4 of LC composite electronic component 10 shown in FIG. 2. Note in FIG. 2, the numeral 12 is the inductor part and the numeral 14 is the condenser part.

Presence of the ferrite phase can be confirmed by carrying out X-ray diffraction, elemental analysis such as EPMA or STEM, and so on of the ferrite composition according to the invention. As preferable embodiments of the ferrite composition according to the invention, $Zn_2SiO_4$ phase is present other than said ferrite phase. The presence of the $Zn_2SiO_4$ phase can be confirmed by X-ray diffraction, elemental analysis such as EPMA or STEM, and so on. In case of confirming with any method, magnification of observation visual filed is preferably 5,000 to 50,000.

Content amount of $Zn_2SiO_4$ phase according to the invention can be confirmed by X-ray diffraction device. Definition and measuring method of content amount of $Zn_2SiO_4$ phase according to the invention will be described hereinafter.

X-ray diffraction intensity of the ferrite composition is measured by X-ray diffraction device; and in the ferrite composition, a peak strength $I_A$ of (311) surface of a spinel type ferrite phase and a peak strength $I_B$ of (113) surface of $Zn_2SiO_4$ phase are measured. Content amount of $Zn_2SiO_4$ phase according to the invention is the value of said $I_A$ divided by said $I_B$ ($I_B/I_A$). Note the value of the intensity shown by X-ray diffraction device minus the background is determined X-ray diffraction intensity.

Content amount of $Zn_2SiO_4$ phase is preferable to show 0.006 or more of the peak strength ratio $I_B/I_A$, which is a ratio of peak strength $I_B$ of (113) surface of $Zn_2SiO_4$ phase with respect to peak strength $I_A$ of (311) surface of a spinel type ferrite phase. Further, although the upper limit of $Zn_2SiO_4$ phase content amount is not particularly limited, said $I_B/I_A$ is preferably 0.190 or less.

Elastic modulus and thermal expansion of $Zn_2SiO_4$ phase is considered relatively smaller than the same of ferrite phase. And it is considered that a preferable inductance characteristic is provided by applying stress based on the difference of the thermal expansion from $Zn_2SiO_4$ phase to ferrite phase. By the reasons above, the present inventors assume that characteristics of ferrite composition, in which $Zn_2SiO_4$ phase is formed, are superior relative to the same of ferrite composition, in which $Zn_2SiO_4$ phase is not formed.

Note $Zn_2SiO_4$ phase can be existent in the ferrite composition after sintering, and may not necessarily be in the ferrite composition before sintering. Further, in case when a part of zinc oxide is mixed with silicon oxide during pulverization of calcined material or in case when zinc silicate ($Zn_2SiO_4$) is added during pulverization of the calcined material, $Zn_2SiO_4$ phase is easy to be formed. In case when a part of zinc oxide is mixed with silicon oxide during pulverization of calcined material, zinc oxide (ZnO) combines with silicon oxide ($SiO_2$) and forms $Zn_2SiO_4$ phase. Note the forming method of $Zn_2SiO_4$ phase is not limited to the above method.

Bismuth oxide ($Bi_2O_3$) has effect lowering the sintering temperature; and further has effect promoting the generation of $Zn_2SiO_4$ phase during sintering process. And, in case when adding bismuth oxide during pulverization of the calcined material, promotion effect of generating $Zn_2SiO_4$ phase becomes large and a stable generation of $Zn_2SiO_4$ phase is carried out.

Further, cobalt oxide ($Co_3O_4$) improves specific resistance and suppresses decrease of Q value with respect to high current amplitude, however, tends to deteriorate temperature characteristic of initial permeability at the same time. However, the existence of $Zn_2SiO_4$ phase suppresses temperature characteristic deterioration of the initial permeability, and at the same time, maximally demonstrates the effect of suppressing decrease of Q value with respect to high current amplitude.

EXAMPLES

Hereinafter, the present invention will be described based on the further details of the examples; however, the invention is not limited to the examples.

Firstly, $Fe_2O_3$, NiO, CuO, ZnO and $SiO_2$ were prepared as materials of the main component. $Bi_2O_3$ and $Co_3O_4$ were prepared as materials of the subcomponent. Note the average grain size of the starting material is preferably 0.05 to 1.00 µm.

Next, powders of the prepared main component material and of the prepared subcomponent material were weighed to obtain the composition of the sintered body as described in Table 1.

After the weighing, $Fe_2O_3$, NiO, CuO and when necessary, a part of ZnO among the prepared main component material were wet mixed for 16 hours by ball mill, and the material mixture was obtained.

Next, calcination was carried out in air after drying the obtained material mixture, and the calcined product was obtained. Calcination temperature was suitably selected within a range from 500 to 900° C. according to the composition of the material mixture. Subsequently, pulverization by ball mill was carried out during the addition of said subcomponent material, $SiO_2$ and the residue of ZnO, not mixed during the wet mixing step, to the calcined product; and the pulverized powder was obtained.

The residue amount of said ZnO added to the calcined product was made 1.0 to 3.0 times the addition amount of said $SiO_2$, in terms of molar amount.

Next, after drying said pulverization powder, 10.0 parts by weight of 6 wt % condense polyvinyl alcohol aqueous solution as a binder were added to 100 parts by weight of the pulverized powder, and granulated thereof and made to a granule. Said granule was pressure formed and obtained a formed body of toroidal shape A (size=outer diameter of 13 mm×inner diameter of 6 mm×height of 3 mm), a formed body of toroidal shape B (size=outer diameter of 8 mm×inner diameter of 4 mm×height of 2.5 mm), and a formed body of a disk shape (size=outer diameter of 12 mm×height of 2 mm).

Next, said each formed body was fired in air at 860 to 900° C., which is the melting point (962° C.) of Ag or less, for 2 hours and obtained the sintered bodies of a toroidal core sample A, a toroidal core sample B and a disk sample. Further, the following characteristic evaluations were performed to the each sample. Note it was confirmed by an X-ray fluorescence analyzer that the compositions of the weighed material powders and of the fired formed body have changed little.

Specific Resistance ρ

In—Ga electrode was coated on both sides of the disk sample, measured DC resistance value, and specific resistance ρ was obtained (unit: Ω·m). The measurement was carried out by IR meter (4329A made by HEWLETT PACKARD). $10^6$ Ω·m or more of the specific resistance ρ in the present examples were determined good. In the example, samples showing less than $10^5$ Ω·m of the specific resistance ρ were determined not being important to carry out the other characteristic evaluations and may be abbreviated the following characteristic evaluations.

Initial Permeability μi

The copper wire was wound to the toroidalcore sample A for 10 turns; and initial permeability μi was measured using LCR meter (4991A made by Agilent Technologies). Measuring conditions were measuring frequency of 1 MHz and measuring temperature of 25° C.

DC-Current Superimposition Characteristic

Permeability μ was measured when 10 turns of the copper wire was wound to the toroidal core sample A and then direct current was impressed. Permeability μ was measured varying the impressed direct current from 0 to 8 A and made into a graph determining the horizontal axis as direct current and the vertical axis as permeability. Permeability when direct current is 0 A is the initial permeability μi. Then, the current value of Idc30% down, which is the value when permeability decreased by 30% from μi, was obtained.

In case when permeability decreased by 30% when impressed direct current is 8 A or less, the direct current when permeability decreased by 30% is Idc30% down. In case when permeability did not decrease by 30% when impressed direct current is 8 A, Idc30% down was calculated from an inclination of the graph when direct current is 8 A.

In case when permeability μ did not change when impressed direct current is between 0 to 8 A, Idc30% down was determined an unsaturated state.

In the present example, DC-current superimposition characteristic was determined good when Idc30% down was unsaturated state or 10.0 A or more.

Lowering Rate of Q

Copper wire was wound to the toroidal core sample B for 6 turns at primary side and 3 turns at secondary side; and by using B-H analyzer (SY-8218 made by Iwatsu test instruments corporation) and amplifier (4101-IW made by NF circuit design bloc), Q values when 100 A/m external magnetic fields is impressed and when 500 A/m external magnetic fields is impressed were respectively measured. Measuring conditions other than the external magnetic field were measuring frequency of 3 MHz and measuring temperature of 25° C. From the measured Q values, lowering rate of Q value, when external magnetic field rises from 100 A/m to 500 A/m, was calculated.

In the present example, in case when lowering rate of Q value is 45.0% or less when external magnetic field rises from 100 A/m to 500 A/m was determined good. Note when lowering rate of Q value is small, deterioration of the Q value with respect to a high current amplitude becomes less.

Temperature Characteristic of Initial Permeability μi

Change rate of initial permeability μi at 25 to 125° C., as reference to a room temperature of 25° C., was obtained. It was determined good when change rate μi is within ±30% in the present example.

Presence or Absence of $Zn_2SiO_4$ Phase and its Content Amount

Presence or absence of $Zn_2SiO_4$ phase in the sintered ferrite composition was examined by STEM. Magnification of the observation visual field was 20,000 times. In addition, $Zn_2SiO_4$ content amount was examined by X-ray diffraction device (X'pert PRO MPD CuKα rays made by Panalytical).

The above test results were compiled in Table 1.

TABLE 1

| Sample No. | mol % | | | | | Parts by weight | | Ωm Specific resistance | μi | A Idc30% down | % Decrease rate of "Q" | % Temperature characteristi | $I_B/I_A$ |
|---|---|---|---|---|---|---|---|---|---|---|---|---|---|
| | $Fe_2O_3$ | NiO | CuO | ZnO | $SiO_2$ | $Co_3O_4$ | $Bi_2O_3$ | | | | | | |
| 5a✗ | 32.89 | 22.87 | 7.10 | 28.74 | 8.39 | 10.00 | 0.75 | 6.8E+05 | 2 | unsaturated | 0.0 | 27.0 | 0.070 |
| 5b | 32.89 | 22.87 | 7.10 | 28.74 | 8.39 | 8.00 | 0.75 | 9.7E+06 | 3 | unsaturated | 0.0 | 25.3 | 0.073 |
| 5c | 32.89 | 22.87 | 7.10 | 28.74 | 8.39 | 5.00 | 0.75 | 3.1E+07 | 5 | unsaturated | 1.1 | 23.7 | 0.058 |
| 1 | 32.89 | 22.87 | 7.10 | 28.74 | 8.39 | 3.00 | 0.75 | 9.7E+07 | 6 | unsaturated | 1.7 | 19.8 | 0.073 |
| 2 | 32.89 | 22.87 | 7.10 | 28.74 | 8.39 | 2.50 | 0.75 | 9.6E+07 | 7 | unsaturated | 3.0 | 15.7 | 0.072 |
| 3 | 32.89 | 22.87 | 7.10 | 28.74 | 8.39 | 1.00 | 0.75 | 3.5E+07 | 10 | 45.0 | 17.4 | 8.0 | 0.073 |
| 4✗ | 33.60 | 16.28 | 6.58 | 33.29 | 10.24 | — | 0.50 | 8.2E+05 | 9 | 22.2 | 34.2 | 2.4 | 0.109 |
| 5d✗ | 40.24 | 26.83 | 8.22 | 20.22 | 4.49 | 10.00 | 0.75 | 1.4E+06 | 3 | unsaturated | 0.1 | 35.2 | 0.026 |
| 5e | 40.24 | 26.83 | 8.22 | 20.22 | 4.49 | 8.00 | 0.75 | 4.5E+06 | 4 | unsaturated | 0.2 | 34.4 | 0.028 |
| 5f | 40.24 | 26.83 | 8.22 | 20.22 | 4.49 | 5.00 | 0.75 | 1.2E+07 | 6 | unsaturated | 0.4 | 31.9 | 0.026 |
| 6 | 40.24 | 26.83 | 8.22 | 20.22 | 4.49 | 3.00 | 0.50 | 9.1E+07 | 10 | 23.2 | 0.2 | 27.9 | 0.028 |
| 7 | 40.24 | 26.83 | 8.22 | 20.22 | 4.49 | 2.00 | 0.50 | 2.0E+07 | 11 | 24.7 | 1.9 | 19.1 | 0.026 |
| 8 | 38.21 | 25.47 | 7.81 | 22.76 | 5.75 | 1.20 | 0.50 | 1.2E+08 | 11 | 37.6 | 7.2 | 13.4 | 0.039 |
| 10 | 35.89 | 23.93 | 7.33 | 25.24 | 7.60 | 0.10 | 0.50 | 5.3E+06 | 11 | 58.0 | 30.3 | 4.6 | 0.061 |
| 11✗ | 35.47 | 23.64 | 7.25 | 25.73 | 7.91 | — | 0.50 | 1.5E+05 | 11 | 45.1 | 32.9 | 3.2 | 0.074 |
| 12✗ | 47.50 | 37.00 | 9.50 | 6.00 | — | 0.80 | — | 5.7E+08 | 25 | 2.9 | 55.0 | 17.3 | 0.004 |
| 13✗ | 27.68 | 16.20 | 6.41 | 38.87 | 10.83 | 0.50 | 7.00 | 1.9E+05 | 11 | 9.9 | 47.6 | 10.3 | 0.114 |
| 17✗ | 40.24 | 26.83 | 8.22 | 20.22 | 4.49 | 1.50 | 10.00 | 8.7E+05 | 12 | 9.9 | 9.6 | 10.5 | 0.020 |
| 18 | 40.24 | 26.83 | 8.22 | 20.22 | 4.49 | 1.50 | 5.00 | 3.1E+06 | 11 | 12.7 | 10.2 | 12.3 | 0.023 |
| 19 | 40.26 | 26.84 | 8.22 | 20.35 | 4.33 | 1.50 | 0.50 | 3.2E+07 | 12 | 17.7 | 3.7 | 16.4 | 0.026 |
| 20 | 40.24 | 26.83 | 8.22 | 20.22 | 4.49 | 1.50 | 0.25 | 1.5E+08 | 9 | 22.9 | 2.6 | 12.7 | 0.029 |
| 21✗ | 40.24 | 26.83 | 8.22 | 20.22 | 4.49 | 1.50 | — | 8.0E+04 | — | — | — | — | — |
| 22 | 34.64 | 23.10 | 7.08 | 26.68 | 8.50 | 1.50 | 1.00 | 1.9E+08 | 6 | unsaturated | 3.7 | 8.9 | 0.075 |
| 23 | 34.62 | 23.08 | 7.07 | 26.42 | 8.81 | 1.50 | 0.50 | 5.4E+06 | 6 | unsaturated | 3.2 | 10.9 | 0.077 |
| 24 | 34.64 | 23.10 | 7.08 | 26.68 | 8.50 | 1.50 | 0.25 | 1.5E+06 | 6 | unsaturated | 1.3 | 8.6 | 0.078 |
| 25✗ | 34.64 | 23.10 | 7.08 | 26.68 | 8.50 | 1.50 | — | 7.3E+04 | — | — | — | — | — |
| 26 | 28.67 | 19.11 | 5.86 | 33.58 | 12.78 | 1.50 | 1.00 | 3.5E+08 | 4 | unsaturated | 1.3 | 7.1 | 0.172 |
| 27✗ | 19.42 | 42.72 | 7.77 | 22.66 | 7.44 | 0.80 | 0.75 | 8.3E+04 | — | — | — | — | — |

TABLE 1-continued

| Sample No. | mol % | | | | | Parts by weight | | Ωm Specific resistance ρ | μi | A Idc30% down | % Decrease rate of "Q" | % Temperature characteristi | $I_B/I_A$ |
|---|---|---|---|---|---|---|---|---|---|---|---|---|---|
| | $Fe_2O_3$ | NiO | CuO | ZnO | $SiO_2$ | $Co_3O_4$ | $Bi_2O_3$ | | | | | | |
| 29 | 28.25 | 36.81 | 8.13 | 22.01 | 4.80 | 0.80 | 0.75 | 7.4E+06 | 8 | 18.2 | 42.4 | 7.3 | 0.047 |
| 30 | 28.03 | 28.48 | 7.20 | 28.24 | 8.06 | 0.80 | 0.75 | 1.4E+08 | 7 | unsaturated | 25.8 | 6.9 | 0.096 |
| 31 | 31.49 | 32.00 | 8.08 | 23.49 | 4.94 | 0.80 | 0.75 | 7.7E+07 | 11 | 12.9 | 35.1 | 9.3 | 0.043 |
| 32 | 33.05 | 27.09 | 7.66 | 25.77 | 6.43 | 0.80 | 0.75 | 2.4E+07 | 11 | 20.9 | 37.4 | 6.7 | 0.067 |
| 33 | 38.70 | 23.14 | 7.58 | 23.62 | 6.97 | 0.80 | 0.50 | 2.2E+07 | 11 | 33.0 | 21.0 | 9.8 | 0.056 |
| 34 | 41.33 | 24.71 | 8.09 | 20.94 | 4.93 | 0.40 | 0.50 | 3.3E+07 | 15 | 12.1 | 39.1 | 6.1 | 0.034 |
| 35 | 36.85 | 15.69 | 9.62 | 29.18 | 8.67 | 0.20 | 1.00 | 3.8E+07 | 13 | 12.4 | 44.3 | 3.4 | 0.075 |
| 36 | 34.74 | 32.87 | 7.10 | 17.13 | 8.16 | 1.20 | 1.00 | 9.3E+07 | 6 | unsaturated | 10.4 | 4.7 | 0.050 |
| 37 | 34.39 | 32.54 | 7.03 | 17.60 | 8.43 | 1.20 | 1.00 | 8.8E+07 | 5 | unsaturated | 11.7 | 3.4 | 0.052 |
| 40✕ | 44.53 | 36.39 | 9.10 | 8.57 | 1.41 | 2.50 | 1.00 | 3.2E+07 | 12 | 8.6 | 1.3 | 12.9 | 0.004 |
| 41 | 40.26 | 32.90 | 8.23 | 14.14 | 4.47 | 0.40 | 0.50 | 2.2E+07 | 10 | 17.2 | 38.8 | 1.6 | 0.030 |
| 42 | 38.20 | 28.75 | 7.80 | 19.29 | 5.95 | 0.40 | 0.50 | 3.2E+06 | 10 | 38.8 | 29.0 | 4.7 | 0.041 |
| 43 | 43.78 | 29.18 | 8.94 | 16.14 | 1.95 | 1.60 | 1.00 | 1.1E+08 | 14 | 10.7 | 0.3 | 15.2 | 0.015 |
| 44✕ | 44.52 | 26.81 | 9.10 | 18.15 | 1.42 | 0.50 | 0.75 | 3.1E+06 | 29 | 7.0 | 81.2 | 5.1 | 0.013 |
| 45 | 34.63 | 20.85 | 7.07 | 28.93 | 8.51 | 0.80 | 0.75 | 3.2E+08 | 10 | 63.5 | 15.8 | 7.8 | 0.069 |
| 47✕ | 42.20 | 15.43 | 8.62 | 30.67 | 3.08 | — | — | 5.4E+04 | 14 | 8.1 | 45.1 | −3.1 | 0.016 |
| 48✕ | 26.01 | 4.48 | 7.55 | 47.27 | 14.69 | 0.50 | 1.00 | 1.2E+09 | 12 | 4.2 | 61.1 | −74.7 | 0.195 |
| 49✕ | 33.86 | 23.30 | 2.18 | 31.60 | 9.06 | 0.20 | 0.75 | 4.3E+04 | — | — | — | — | — |
| 51 | 33.77 | 18.52 | 6.90 | 31.04 | 9.78 | 0.80 | 0.75 | 3.8E+08 | 10 | 30.9 | 17.8 | 8.3 | 0.092 |
| 52 | 33.84 | 15.28 | 10.19 | 31.90 | 8.78 | 0.20 | 0.50 | 3.2E+07 | 12 | 11.6 | 42.8 | 5.8 | 0.089 |
| 53 | 33.80 | 13.08 | 12.36 | 31.65 | 9.10 | 0.20 | 0.50 | 8.9E+06 | 12 | 12.0 | 41.4 | 5.4 | 0.089 |
| 55 | 38.53 | 22.47 | 8.83 | 25.24 | 4.93 | 0.80 | 1.00 | 2.7E+08 | 17 | 10.6 | 35.4 | 8.9 | 0.038 |
| 56 | 38.35 | 22.37 | 8.79 | 23.79 | 6.70 | 0.80 | 1.00 | 1.3E+09 | 11 | 27.2 | 34.7 | 6.8 | 0.053 |
| 57 | 37.96 | 22.14 | 8.70 | 20.74 | 10.46 | 0.80 | 1.00 | 1.7E+08 | 9 | 26.4 | 41.1 | 4.6 | 0.053 |

✕: are comparative examples

It was confirmed that all the characteristics were good when content amounts of the main component and of the subcomponent are within the range of the invention.

In case when composition of the main component is within the above range and $Co_3O_4$ is not included (Sample Nos. 4, 11 and 47), specific resistance ρ was less than $10^6$. In case when additional amount of $Co_3O_4$ exceeds 8.0 parts by weight (Sample Nos. 5a and 5d), temperature characteristic of initial permeability and specific resistance ρ were deteriorated.

In case when composition of the main component is within the range of the invention and $Bi_2O_3$ is not included (Sample Nos. 21, 25 and 47), specific resistance ρ remarkably decreases and became less than $10^5$. In case when an additional amount of $Bi_2O_3$ exceeds 5.00 parts by weight (Sample No. 13), specific resistance ρ became less than $10^6$ and deteriorated DC-current superimposition characteristic and lowering rate of Q value.

In case when content amount of $Fe_2O_3$ is less than 23.0 mole % (Sample No. 27), specific resistance remarkably decreased and became less than $10^5$.

In case when content amount of ZnO exceeds 43.0 mole % (Sample No. 48), DC-current superimposition characteristic and lowering rate of Q value were deteriorated. In addition, temperature characteristic of initial permeability was unable to be measured, due to the decrease of Curie temperature to 100° C. or less.

In case when content amount of CuO is less than 3.0 mole % (Sample No. 49), specific resistance remarkably decreased and became less than $10^5$.

In case when content amount of $SiO_2$ is less than 1.5 mole % (Sample Nos. 12, 40 and 44), DC-current superimposition characteristic deteriorated. Lowering rate of Q value was also deteriorated in Sample Nos. 12 and 44. In case when content amount of $SiO_2$ exceeds 13.0 mole % (Sample No. 48), DC-current superimposition characteristic and lowering rate of Q value were deteriorated.

It was confirmed that $Zn_2SiO_4$ phase exists in the sintered ferrite compositions according to all the present examples. In addition, it was confirmed that content amount ($I_B/I_A$) of said $Zn_2SiO_4$ phase is 0.006 or more.

Next, the prepared main component material powder and subcomponent material powder were carried out similarly with the examples described in Table 1, except said powders were weighed to make the compositions as described in Tables 2 to 8. Note a predetermined amount of magnesium oxide was added to Sample No. 121 and a predetermined amount of aluminum oxide was added to Sample No. 122.

TABLE 2

| Sample No. | mol % | | | | | Parts by weight | | Ωm Specific resistance ρ | μi | A Idc30% down | % Decrease rate of "Q" | % Temperature characteristic | $I_B/I_A$ |
|---|---|---|---|---|---|---|---|---|---|---|---|---|---|
| | $Fe_2O_3$ | NiO | CuO | ZnO | $SiO_2$ | $Co_3O_4$ | $Bi_2O_3$ | | | | | | |
| 61 | 28.0 | 31.0 | 7.5 | 25.5 | 8.0 | 0.80 | 0.75 | 3.4E+06 | 9 | 62.5 | 24.4 | 6.8 | 0.082 |
| 62 | 33.0 | 26.0 | 7.5 | 25.5 | 8.0 | 0.80 | 0.75 | 4.8E+06 | 8 | unsaturated | 15.6 | 7.0 | 0.067 |
| 63 | 35.0 | 24.0 | 7.5 | 25.5 | 8.0 | 0.80 | 0.75 | 1.3E+07 | 8 | unsaturated | 11.9 | 8.5 | 0.068 |
| 64 | 37.0 | 22.0 | 7.5 | 25.5 | 8.0 | 0.80 | 0.75 | 8.9E+06 | 9 | unsaturated | 25.7 | 6.9 | 0.065 |
| 65 | 40.0 | 19.0 | 7.5 | 25.5 | 8.0 | 0.80 | 0.75 | 2.5E+06 | 9 | 23.1 | 35.9 | 5.2 | 0.055 |
| 66 | 44.0 | 15.0 | 7.5 | 25.5 | 8.0 | 0.80 | 0.75 | 3.5E+06 | 11 | 10.3 | 44.1 | −8.6 | 0.006 |

TABLE 3

| Sample No. | mol % Fe$_2$O$_3$ | NiO | CuO | ZnO | SiO$_2$ | Parts by weight Co$_3$O$_4$ | Bi$_2$O$_3$ | Ωm Specific resistance ρ | μi | A Idc30% down | % Decrease rate of "Q" | % Temperature characteristic | I$_B$/I$_A$ |
|---|---|---|---|---|---|---|---|---|---|---|---|---|---|
| 71 | 35.0 | 26.0 | 5.5 | 25.5 | 8.0 | 0.80 | 0.75 | 4.1E+07 | 11 | 22.3 | 22.0 | 8.6 | 0.071 |
| 72 | 35.0 | 24.5 | 7.0 | 25.5 | 8.0 | 0.80 | 0.75 | 4.5E+07 | 9 | unsaturated | 15.6 | 8.5 | 0.067 |
| 63 | 35.0 | 24.0 | 7.5 | 25.5 | 8.0 | 0.80 | 0.75 | 1.3E+07 | 8 | unsaturated | 11.9 | 8.5 | 0.068 |
| 73 | 35.0 | 23.5 | 8.0 | 25.5 | 8.0 | 0.80 | 0.75 | 2.0E+07 | 9 | unsaturated | 12.9 | 8.0 | 0.067 |
| 74 | 35.0 | 22.5 | 9.0 | 25.5 | 8.0 | 0.80 | 0.75 | 7.5E+07 | 9 | unsaturated | 14.8 | 7.2 | 0.068 |
| 75 | 35.0 | 19.5 | 12.0 | 25.5 | 8.0 | 0.80 | 0.75 | 4.5E+07 | 9 | unsaturated | 13.3 | 6.7 | 0.065 |
| 76 | 35.0 | 17.5 | 14.0 | 25.5 | 8.0 | 0.80 | 0.75 | 2.0E+07 | 9 | unsaturated | 14.4 | 6.6 | 0.065 |

TABLE 4

| Sample No. | mol % Fe$_2$O$_3$ | NiO | CuO | ZnO | SiO$_2$ | Parts by weight Co$_3$O$_4$ | Bi$_2$O$_3$ | Ωm Specific resistance ρ | μi | A Idc30% down | % Decrease rate of "Q" | % Temperature characteristic | I$_B$/I$_A$ |
|---|---|---|---|---|---|---|---|---|---|---|---|---|---|
| 81 | 35.0 | 45.5 | 7.5 | 4.0 | 8.0 | 0.80 | 0.75 | 1.2E+06 | 3 | unsaturated | 6.7 | 0.0 | 0.005 |
| 82 | 35.0 | 44.5 | 7.5 | 5.0 | 8.0 | 0.80 | 0.75 | 2.3E+06 | 4 | unsaturated | 7.9 | 0.2 | 0.007 |
| 83 | 35.0 | 41.0 | 7.5 | 8.5 | 8.0 | 0.80 | 0.75 | 1.8E+06 | 5 | 43.6 | 13.7 | −0.5 | 0.007 |
| 84 | 35.0 | 37.5 | 7.5 | 12.0 | 8.0 | 0.80 | 0.75 | 2.7E+06 | 8 | 17.9 | 23.5 | 0.6 | 0.014 |
| 85 | 35.0 | 28.5 | 7.5 | 21.0 | 8.0 | 0.80 | 0.75 | 9.7E+06 | 6 | unsaturated | 15.6 | 2.7 | 0.061 |
| 63 | 35.0 | 24.0 | 7.5 | 25.5 | 8.0 | 0.80 | 0.75 | 1.3E+07 | 8 | unsaturated | 11.9 | 8.5 | 0.068 |
| 86 | 35.0 | 17.5 | 7.5 | 32.0 | 8.0 | 0.80 | 0.75 | 5.4E+08 | 10 | 39.7 | 16.0 | 10.2 | 0.091 |
| 87 | 35.0 | 10.5 | 7.5 | 39.0 | 8.0 | 0.80 | 0.75 | 7.8E+09 | 12 | 10.5 | 35.4 | 13.7 | 0.124 |

TABLE 5

| Sample No. | mol % Fe$_2$O$_3$ | NiO | CuO | ZnO | SiO$_2$ | Parts by weight Co$_3$O$_4$ | Bi$_2$O$_3$ | Ωm Specific resistance ρ | μi | A Idc30% down | % Decrease rate of "Q" | % Temperature characteristic | I$_B$/I$_A$ |
|---|---|---|---|---|---|---|---|---|---|---|---|---|---|
| 91 | 35.0 | 30.5 | 7.5 | 25.5 | 1.5 | 0.80 | 0.75 | 1.5E+06 | 7 | 10.6 | 42.0 | −1.3 | 0.013 |
| 92 | 35.0 | 29.0 | 7.5 | 25.5 | 3.0 | 0.80 | 0.75 | 8.7E+06 | 11 | 10.3 | 44.3 | 2.9 | 0.025 |
| 93 | 35.0 | 26.5 | 7.5 | 25.5 | 5.5 | 0.80 | 0.75 | 2.1E+08 | 12 | 15.9 | 28.2 | 8.3 | 0.048 |
| 94 | 35.0 | 25.0 | 7.5 | 25.5 | 7.0 | 0.80 | 0.75 | 6.6E+08 | 12 | 23.9 | 1.5 | 8.3 | 0.054 |
| 63 | 35.0 | 24.0 | 7.5 | 25.5 | 8.0 | 0.80 | 0.75 | 1.3E+07 | 8 | unsaturated | 11.9 | 8.5 | 0.068 |
| 95 | 35.0 | 22.5 | 7.5 | 25.5 | 9.5 | 0.80 | 0.75 | 9.5E+06 | 5 | unsaturated | 12.2 | 3.0 | 0.084 |
| 96 | 35.0 | 21.0 | 7.5 | 25.5 | 11.0 | 0.80 | 0.75 | 8.9E+06 | 5 | unsaturated | 7.1 | 3.9 | 0.107 |
| 97 | 35.0 | 19.0 | 7.5 | 25.5 | 13.0 | 0.80 | 0.75 | 1.7E+08 | 4 | unsaturated | 6.2 | 4.5 | 0.130 |

TABLE 6

| Sample No. | mol % Fe$_2$O$_3$ | NiO | CuO | ZnO | SiO$_2$ | Parts by weight Co$_3$O$_4$ | Bi$_2$O$_3$ | Ωm Specific resistance ρ | μi | A Idc30% down | % Decrease rate of "Q" | % Temperature characteristic | I$_B$/I$_A$ |
|---|---|---|---|---|---|---|---|---|---|---|---|---|---|
| 101 | 35.0 | 24.0 | 7.5 | 25.5 | 8.0 | 0.10 | 0.75 | 1.2E+06 | 10 | 50.8 | 43.5 | 2.8 | 0.065 |
| 102 | 35.0 | 24.0 | 7.5 | 25.5 | 8.0 | 0.40 | 0.75 | 3.7E+07 | 10 | 80.9 | 29.0 | 4.2 | 0.066 |
| 63 | 35.0 | 24.0 | 7.5 | 25.5 | 8.0 | 0.80 | 0.75 | 1.3E+07 | 8 | unsaturated | 11.9 | 8.5 | 0.068 |
| 103 | 35.0 | 24.0 | 7.5 | 25.5 | 8.0 | 2.10 | 0.75 | 3.6E+08 | 7 | unsaturated | 1.5 | 14.0 | 0.066 |
| 104 | 35.0 | 24.0 | 7.5 | 25.5 | 8.0 | 3.00 | 0.75 | 1.8E+08 | 6 | unsaturated | 1.0 | 16.6 | 0.064 |
| 105 | 35.0 | 24.0 | 7.5 | 25.5 | 8.0 | 5.00 | 0.75 | 4.1E+07 | 4 | unsaturated | 0.2 | 23.1 | 0.061 |
| 106 | 35.0 | 24.0 | 7.5 | 25.5 | 8.0 | 8.00 | 0.75 | 4.8E+06 | 3 | unsaturated | 0.1 | 26.1 | 0.060 |

TABLE 7

| Sample No. | mol % | | | | | Parts by weight | | Ωm Specific resistance ρ | μi | A Idc30% down | % Decrease rate of "Q" | % Temperature characteristic | $I_B/I_A$ |
|---|---|---|---|---|---|---|---|---|---|---|---|---|---|
| | $Fe_2O_3$ | NiO | CuO | ZnO | $SiO_2$ | $Co_3O_4$ | $Bi_2O_3$ | | | | | | |
| 111 | 35.0 | 24.0 | 7.5 | 25.5 | 8.0 | 0.80 | 0.25 | 1.6E+06 | 6 | 11.7 | 15.2 | 3.1 | 0.066 |
| 112 | 35.0 | 24.0 | 7.5 | 25.5 | 8.0 | 0.80 | 0.50 | 2.1E+07 | 9 | unsaturated | 10.2 | 7.7 | 0.068 |
| 63 | 35.0 | 24.0 | 7.5 | 25.5 | 8.0 | 0.80 | 0.75 | 1.3E+07 | 8 | unsaturated | 11.9 | 8.5 | 0.068 |
| 113 | 35.0 | 24.0 | 7.5 | 25.5 | 8.0 | 0.80 | 1.00 | 3.4E+07 | 8 | unsaturated | 13.8 | 8.6 | 0.068 |
| 114 | 35.0 | 24.0 | 7.5 | 25.5 | 8.0 | 0.80 | 3.00 | 2.0E+08 | 9 | 94.6 | 17.2 | 6.6 | 0.058 |
| 115 | 35.0 | 24.0 | 7.5 | 25.5 | 8.0 | 0.80 | 5.00 | 2.9E+07 | 9 | 70.3 | 18.6 | 6.8 | 0.062 |

TABLE 8

| Sample No. | Parts by weight | | Ωm Specific resistance ρ | μi | A Idc30% down | % Decrease rate of "Q" | % Temperature characteristic | $I_B/I_A$ |
|---|---|---|---|---|---|---|---|---|
| | MgO | $Al_2O_3$ | | | | | | |
| 63 | 0.00 | 0.00 | 1.3E+07 | 8 | unsaturated | 11.9 | 8.5 | 0.068 |
| 121 | 0.50 | 0.00 | 4.2E+07 | 8 | unsaturated | 13.0 | 7.5 | 0.062 |
| 122 | 0.00 | 0.05 | 5.4E+07 | 8 | unsaturated | 13.5 | 9.1 | 0.068 |

From Tables 2 to 7, it was confirmed that all the characteristics become good when content amount of the main component and of the subcomponent are within the range of the invention, even when content amount of each component is varied within the predetermined range. From Table 8, it was confirmed that all the characteristics become good when content amount of the main component and the subcomponent are within the range of the invention, even when magnesium oxides and aluminum oxides are added.

DESCRIPTIONS OF THE NUMERALS

1: Multilayer inductor
2: Element
3: Terminal electrode
4: Ferrite layer
5: Coil conductor
5a and 5b: Extraction electrode
10: LC composite electrode device
12: Inductor part
14: Condenser part

What is claimed is:

1. A ferrite composition comprising:
a main component comprising 23.0 to 47.0 mole % of Fe compound in terms of $Fe_2O_3$, 3.0 to 16.0 mole % of Cu compound in terms of CuO, 4.0 to 39.0 mole % of Zn compound in terms of ZnO, 1.5 to 13.0 mole % of Si compound in terms of $SiO_2$, and a residue of Ni compound; and
a subcomponent comprising, with respect to 100 parts by weight of the main component, 0.1 to 8.0 parts by weight of Co compound in terms of $Co_3O_4$ and 0.25 to 5.00 parts by weight of Bi compound in terms of $Bi_2O_3$.

2. The ferrite composition as set forth in claim 1, having $Zn_2SiO_4$ phase.

3. An electronic component including a ferrite sintered body, comprised of
the ferrite composition as set forth in claim 1.

4. An electronic component including a ferrite sintered body, comprised of
the ferrite composition as set forth in claim 2.

* * * * *